(12) United States Patent
Freeman et al.

(10) Patent No.: US 6,803,642 B2
(45) Date of Patent: Oct. 12, 2004

(54) BIPOLAR DEVICE HAVING NON-UNIFORM DEPTH BASE-EMITTER JUNCTION

(75) Inventors: Gregory G. Freeman, Hopewell Junction, NY (US); Jae-Sung Rieh, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 10/008,383

(22) Filed: Dec. 6, 2001

(65) Prior Publication Data

US 2003/0109109 A1 Jun. 12, 2003

(51) Int. Cl.[7] .................. H01L 21/331; H01L 29/80; H01L 31/112
(52) U.S. Cl. ................ 257/571; 257/583; 257/586
(58) Field of Search .................... 257/571, 583, 257/586, 588, 592, 616; 438/419, 420

(56) References Cited

U.S. PATENT DOCUMENTS

| | | | |
|---|---|---|---|
| 4,916,083 A | | 4/1990 | Monkowski et al. ....... 438/367 |
| 4,975,381 A | * | 12/1990 | Taka et al. ................. 438/367 |
| 4,985,744 A | | 1/1991 | Spratt et al. ................ 257/370 |
| 5,017,990 A | * | 5/1991 | Chen et al. ................. 257/586 |
| 5,106,767 A | * | 4/1992 | Comfort et al. ............ 438/359 |
| 5,316,957 A | | 5/1994 | Spratt et al. ................ 438/311 |

FOREIGN PATENT DOCUMENTS

| | | |
|---|---|---|
| EP | 290763 A1 | 11/1988 |
| JP | 5175222 A | 7/1993 |

OTHER PUBLICATIONS

English Abstract of JP5175222A and EPO290763A1.

* cited by examiner

Primary Examiner—Minhloan Tran
Assistant Examiner—Thomas L Dickey
(74) Attorney, Agent, or Firm—Joseph P. Abate

(57) ABSTRACT

A non-uniform depth base-emitter junction, with deeper junction at the lateral portions of the emitter, preferably coupled with a recessed and raised extrinsic base, bipolar transistor, and a method of making the same. The bipolar transistor includes a substrate, a silicon germanium layer formed on the substrate, a collector layer formed on the substrate, a recessed and raised extrinsic base layer formed on the silicon germanium layer, and a silicon pedestal on which an emitter layer is formed. The emitter has non-uniform depths into the base layer.

10 Claims, 3 Drawing Sheets

BIPOLAR DEVICE HAVING NON-UNIFORM DEPTH BASE-EMITTER JUNCTION

BACKGROUND OF THE INVENTION

1. Field of the Invention

The present invention relates generally to semiconductor devices and, more particularly, to a bipolar device having a recessed and raised extrinsic base, and a method for making such a device.

2. Description of the Related Art

Bipolar transistors are three-region, two-junction devices. A typical bipolar transistor is fabricated by sequentially forming on a substrate, a collector layer or region, a base layer or region, and an emitter layer or region. An emitter electrode is formed on the emitter layer. A base electrode is formed on the base layer, on the same side of the substrate and adjacent to the emitter electrode.

Electrically, bipolar transistors can be considered as two diodes back to back. A current flows from the emitter region through the base into the collector. When there is no current to the base, the transistor is turned off. When the transistor is on, the current flows. Only a small current is required to turn the base on enough to allow a current to flow through the entire transistor.

Many bipolar circuits are designed with NPN transistors. NPN represents the respective conductivity types of the emitter, base, and collector. Bipolar transistors feature, e.g., fast switching speeds. The speed and performance of a bipolar transistor is governed by a number of factors, including a vertical base dopant film thickness (base width), the base resistance, and the base-collector and base-emitter capacitances.

One factor affecting the speed and performance of a bipolar transistor is the base width. Ideally, the base width is made as small as possible. The thickness of the base film is preferably as thin as possible given the deposition, diffusion, and thermal cycle constraints of a particular technology integration scheme, such as whether CMOS source and drain implants and anneals were performed following the base deposition. Typically, the thickness of the film is considered as a one-dimensional thickness, disposed directly under a center of the emitter of the device. However, an NPN device is better considered as a two-dimensional structure, which from one technological generation to the next, shrinks in a lateral dimension, and the two-dimensional nature becomes more pronounced. In particular, at lateral portions of the emitter which interface to the base, there is located a part of the base-emitter junction which penetrates less deep (ie, is shallow) into the base film. See, for example, FIG. 14 which shows a substantially planar shallow base-emitter junction 711, 722, and see also U.S. Pat. No. 4,985,744 which is incorporated in its entirety herein. Thus, the base width is large at this location. Device performance suffers from the presence of this shallow part because carriers injected therein take a longer time to transit the base of the device. Thus, reduction or elimination of this shallow part of the junction could improve the speed and performance of an NPN device.

Furthermore, it is well known that, during a high injection operation of a bipolar transistor, minority carrier injection is non-uniform across the base-emitter junction. Because the injection of carriers is exponentially related to the potential applied across the base-emitter junction, this potential drop influences the device such that principally the lateral portion of the emitter affects injects carriers. In this state, the center portion of the NPN device is contributing little to the operation of the device and does not in effect inject carriers. Yet, there is still a capacitance associated with the center portion of the device. This capacitance stores charge and, thus, is a capacitive load which must be accommodated by the device, and which makes the device operate more slowly.

SUMMARY OF THE INVENTION

Thus, to enhance performance, it is desirable to have the base-emitter junction configured such that the emitter at lateral portions thereof extends farther into the base (ie, is at a deeper depth in to the base) than at the center portion, such that the deeper portions dominate the injection of carriers and the capacitance of the device, and that the center portion contributes little capacitance. In effect, the device benefits by converting the "slow" part of the junction into a "fast" deeper part.

The base-emitter junction issues described above seem to have received little notice in the past because devices have had relatively wide emitters, where the "slow" part injection is a smaller part of the total. In addition, devices are being biased into higher injection states in order to obtain higher performance and, therefore, the mechanisms described above are becoming more pronounced. Thus, there seems to be a need in the art to provide a bipolar transistor having a modified depth emitter-base junction compared to conventional bipolar devices.

The present invention satisfies this need by providing a base-emitter junction having a non-uniform depth in a bipolar transistor, and a method of making the same.

As embodied and broadly described herein, the present invention is broadly drawn to a bipolar transistor and a method of making the same. The bipolar transistor includes a substrate, and a silicon germanium layer formed by blanket epitaxy on the substrate. A collector layer is also formed on the substrate, and a recessed and raised extrinsic base layer is formed on the silicon germanium layer. An emitter or emitter layer is also formed on the silicon germanium layer, and a junction is created between the emitter or emitter layer and the intrinsic base layer. According to an essential feature of the present invention, the lateral portions of the emitter extend deeper into the base than the central portion of the emitter. In other words, the lateral portion of the emitter has a Depth D1 while the central portion of the emitter has a depth D2 which is less than D1. Preferably, D1 is greater than D2 by a distance in a range from approximately (±10%) two-10 nm. The transistor further includes an emitter contact or electrode formed on the emitter layer, a base contact or electrode formed on the raised extrinsic base layer, and a collector contact or electrode formed on the collector layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention. In the drawings.

DETAILED DESCRIPTION OF EMBODIMENTS OF THE INVENTION

Reference will now be made in detail to the present embodiments of the invention, examples of which are illustrated in the accompanying drawings. Wherever possible, the same reference numbers will be used throughout the drawings to refer to the same or like parts.

The present invention is drawn broadly to a bipolar device having a non-planar base-emitter junction and a method for making such a device. The method for making the bipolar device of the present invention will be described in conjunction with the description of the bipolar device structure, with reference to FIGS. 1–13, and 15.

Figure 1:
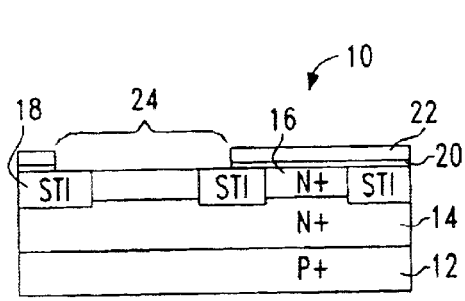
FIGS. 1–13 are cross-sectional views of a bipolar device having a non-planar base-emitter junction in accordance with an embodiment of the present invention, and as it is formed in accordance with a method of the present invention.

Referring now specifically to the drawings, an embodiment of the bipolar device of the present invention is illustrated in FIGS. 1–13, and shown generally as reference numeral 10. A semiconductor wafer or substrate 12, as shown in FIG. 1, is provided as the starting material for the bipolar device of the present invention. The substrate 12 may be made from a variety of materials, including a silicon material having a positive (p+ or p−) type conductivity, or having a p− type conductivity on a p+ type conductivity. In the initial steps of the method of the present invention, conventional processing techniques may be performed on the substrate 12 to form isolation regions such as shallow trench isolation (STI) regions 18, and/or deep trench isolation regions, a deep subcollector 14, and a collector contact region 16.

The dopant for the subcollector 14 and the collector contact region 16 is preferably a negative (n) type, such as arsenic, antimony, or phosphorous having a concentration between $10^{18}$ to $10^{21}$ atoms/cm$^3$. The subcollector 14 may have a variety of thicknesses, but preferably has a thickness of between 0.5 to 2.0 microns ($\mu$m), and may be located between 0 to 2.0 $\mu$m from the top surface of the substrate 12, as shown in FIG. 1.

In the next step, a layer or film 20 of silicon dioxide (SiO$_2$) or other material capable of forming an etch-stop dielectric is disposed (e.g., deposited or grown) through oxidation across the complete surface of the device 10 shown in FIG. 1. Preferably, silicon dioxide layer 20 has a thickness in the range of 10 to 50 nanometers (nm). A layer or film 22 of polysilicon or amorphous silicon may be subsequently deposited upon silicon dioxide layer 20 to form a seed layer, although the layer 22 may be omitted. Preferably, optional layer 22 has a thickness in the range of 10 to 100 nm.

Conventional photolithographic and etching techniques are employed to remove a portion of polysilicon layer 22, and a portion of silicon dioxide layer 20. Various conventional techniques employed by the present invention are taught, for example, in U.S. Pat. No. 4,985,744, previously incorporated herein by reference. The removed portions of polysilicon layer 22 and silicon dioxide layer 20 occur over a region 24 which will become an intrinsic region of the bipolar device 10 of the present invention. Silicon dioxide layer 20 and polysilicon layer 22 remain over collector contact region 16, in addition to other regions of the bipolar device 10.

Figure 2:
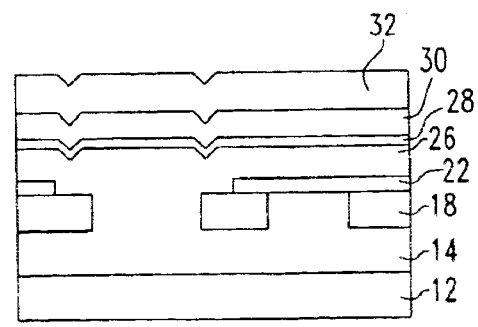

The next steps of the method of the present invention are shown in FIG. 2. A semiconductor layer or film 26 is deposited upon the upper surface of the device shown in FIG. 1, including polysilicon layer 22 and intrinsic region 24. Film 26 grows epitaxially on region 24 and may grow polycrystalline over other regions of bipolar device 10, although it is not necessary that film 26 continue beyond the single crystalline region 24. Although film 26 is to be selectively grown over region 24, it may also be deposited as a blanket film over the entire device. Film 26 preferably includes silicon germanium (SiGe) grown through blanket epitaxy, and forms the deposited intrinsic base of the bipolar device 10 of the present invention.

In the next steps as shown in FIG. 2, additional layers or films are deposited upon SiGe film 26. These additional films are mandrel films that will be later removed, and, thus, their choice of construction may vary depending upon their selectivity to various etches. By way of example only, one construction may include a silicon dioxide (SiO$_2$) layer or film 28 grown or deposited upon SiGe film 26, a polysilicon layer or film 30 deposited upon silicon dioxide film 28, and a silicon nitride layer or film 32 deposited upon polysilicon film 30, all by conventional techniques. Typical thicknesses for silicon dioxide film 28, polysilicon film 30, and silicon nitride film 32 may range from 5 to 20 nm, 50 to 300 nm, and 50 to 300 nm, respectively.

Figure 3:
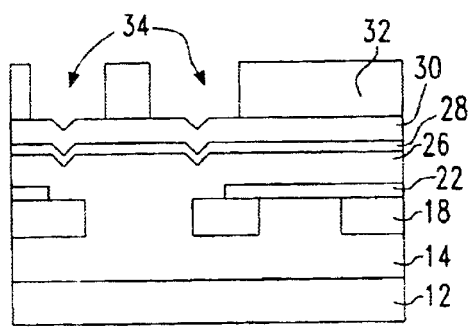
Figure 4:
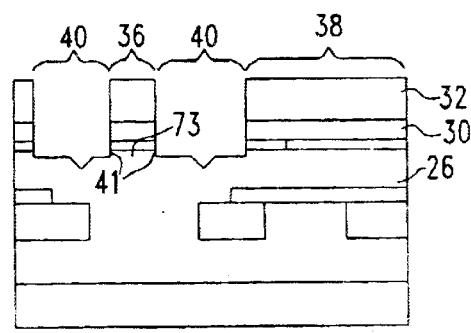

As shown in FIGS. 3 and 4, the next steps of the method include etching portions of silicon nitride film 32 using conventional photolithographic and etching techniques, and etching portions of polysilicon film 30 that lie below the etched portions of silicon nitride film 32 using a conventional anisotropic etch process, to form openings 34. Because portions of silicon nitride film 32 are covered with a photoresist, it is not etched in a region 36 of the intended emitter of the bipolar device 10, and in a large region 38 outside the region of intrinsic device operation, as shown in FIG. 4. Films 32, 30 are removed over locations where low resistance regions 40 of the extrinsic base of bipolar device 10 are intended.

Using films 32, 30 as a mask, silicon dioxide film 28 is removed from regions 40. See FIG. 4. A recess etch is then applied to the extrinsic base region 40, which may etch a small distance (e.g., 5–50 nm) into the SiGe film 26, to a distance comparable to the base-emitter junction depth yet to be formed. The etch may be a timed anisotropic dry etch, or a wet chemical etch, which etches silicon selective to Ge-doped silicon or B-doped silicon. The result is formation of a slight recess 41 as shown in FIG. 4. The purpose of this recess is to form a silicon pedestal 73 in the location or region 36, the same or slightly smaller width as the yet-to-be formed emitter, so that the diffused-in junction will be the same width as the width of the silicon pedestal, and so that a deeper junction may be formed at the lateral portions of this silicon pedestal, as will be described.

Following this step, an optional 5–100 nm thick passivation dielectric 43 may be formed by conventional techniques, for the purpose of forming a low defect surface adjacent to the emitter-base junction, and to provide a film which may be controllably recessed.

Figure 5:
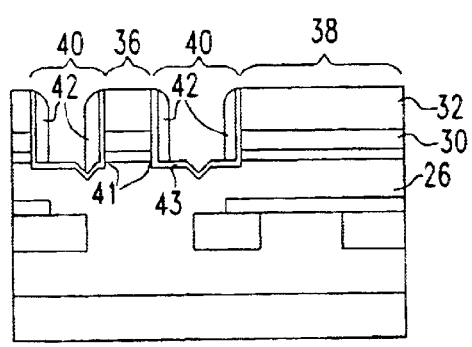

In a next step of the method, as shown in FIG. 5, sidewall spacers 42 are formed on the sidewalls of the remaining portions of polysilicon film 30 and silicon nitride film 32, using conventional deposition and etch procedures. Sidewall spacers 42 may be formed from a variety of materials, including for example, silicon nitride, silicon dioxide, or a combination of the two. The width of each spacer 42 may vary in a range of 10 to 70 nm.

Figure 6:
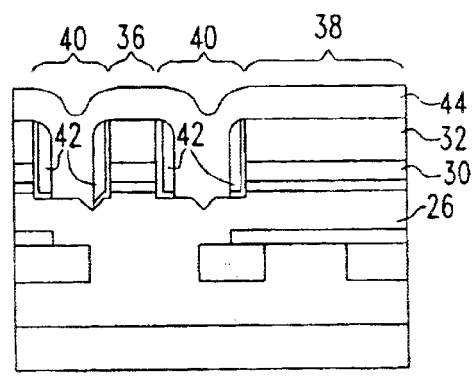

In the next step of the method of the present invention, as shown in FIG. 6, the silicon dioxide film 43 is removed from the region 40, and a layer or film 44 that will form a raised extrinsic base is deposited upon the upper surface of the device shown in FIG. 5. Film 44 may be a highly-doped, extrinsic, polysilicon or an amorphous silicon, and may or may not be in-situ doped. If film 44 is in-situ doped, the dopant type will be the same conductivity as the base dopant. For an NPN-type transistor, the dopant is typically boron. Film 44 may be deposited to a thickness greater than the total thickness of the films 28, 30, 32.

Figure 7:
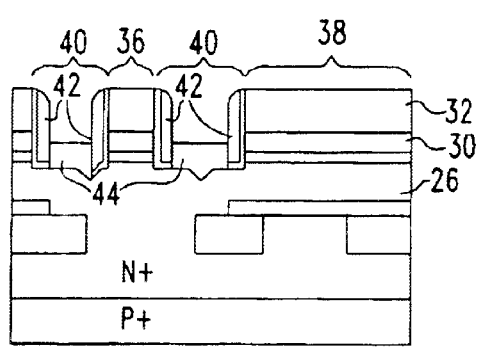

In the next step of the method, as shown in FIG. 7, film 44 is planarized to the top surface of silicon nitride film 32 using a conventional planarization process such as a chemical-mechanical polishing (CMP) technique, and is recessed to a thickness in a range of 20 to 100 nm, using a conventional etch technique. If film 44 is not doped during deposition, it may be doped following the recess step through a known blanket implantation operation. Planarization of film 44 minimizes resistive elements common in non-planar surfaces, and enables formation of uniform salicide layers on film 44, resulting in increased device performance.

Figure 8:
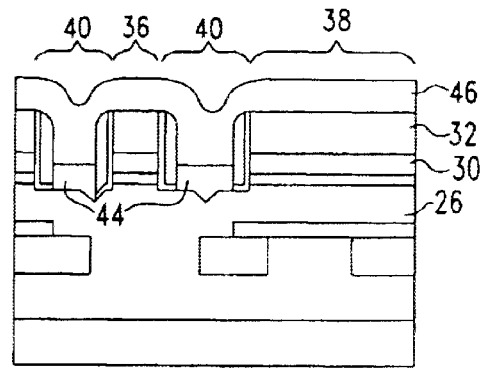
Figure 9:
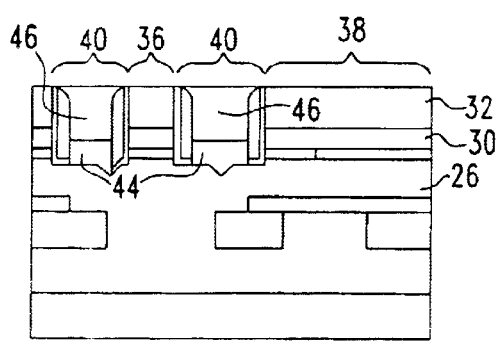

As shown in FIGS. 8 and 9, the next steps of the method of the present invention include depositing an insulating film 46 upon the top surface of the device shown in FIG. 7, and planarizing insulating film 46 to the top of silicon nitride film 32 using a conventional CMP technique. Insulating film 46 is preferably deposited to a thickness greater than the total thicknesses of films 28, 30, 32 less the thickness of film 44. Insulating film 46 may be made from a variety of materials, including but not limited to deposited silicon dioxide.

Figure 10:
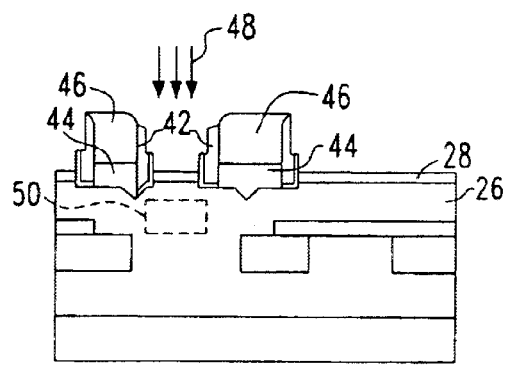

As shown in FIG. 10, the next step of the method includes removing mandrel films 32, 30 using a combination of conventional wet etch and dry etch techniques. Mandrel films 32, 30 may be removed from both regions 36, 38, or photolithographically limited to removal from only the region 36. Spacers 42 remain intact during this removal step in order to isolate electrically the emitter and the base of bipolar device 10. If required, to reduce the well-known "base push-out" effect during device operation, a collector dopant 48 may be implanted following removal of mandrel films 32 and 30, through the opening of region 36, to form a self-aligned collector 50. Dopant implant forms the self-aligned collector 50 because it will be blocked from portions of single-crystal silicon outside region 36 of bipolar device 10 if films 28, 30, 32 are sufficiently thick such as greater than 100 nm.

Figure 11:
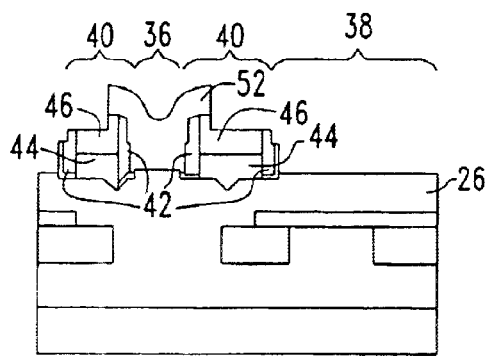

As shown in FIG. 11, the next step of the method includes removing silicon dioxide film 28 from the planar surface of the silicon pedestal and, at the same time, removal of a portion of silicon dioxide film 43 from the edges of the silicon pedestal 73 with a conventional wet etch technique, forming a 2–10 nm deep recess between the silicon pedestal 73 and the adjacent dielectric spacer 42. This is a key step, because removal of the silicon dioxide film 43 from the corners of the silicon pedestal helps to define the depths D1 of the non-uniform depth emitter-base junction. With application of a longer timed etch, film 43 is recessed a deeper amount, a deeper region of the silicon pedestal edge is exposed, and the junction will be more deep. Application of a shorter etch exposes less of the pedestal edge and thus maintains a more planar junction. In the absence of film 43, the spacer dielectric 42 may be etched slightly to define a similar recess adjacent to the silicon pedestal.

The next step is to apply the emitter film. A polysilicon or amorphous silicon film 52 having a thickness in the range of 30 to 200 nm is then deposited upon the device shown in FIG. 11. Film 52 may be in-situ doped with the polysilicon or amorphous silicon deposition, or implanted following the deposition. The dopant is preferably an in-situ doped phosphorous that minimizes the temperatures required to diffuse the dopant slightly into the intrinsic base film 26, as opposed to arsenic which requires higher temperatures. The emitter film fills the recess in film 43 adjacent to the silicon pedestal, and provides dopant for the deeper emitter junction.

Standard photolithographic steps are then employed to mask the region of polysilicon film 52 to remain following a conventional anisotropic etch, and form the emitter contact in region 36.

Figure 12:
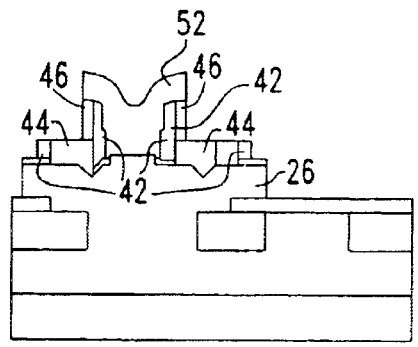
Figure 13A:
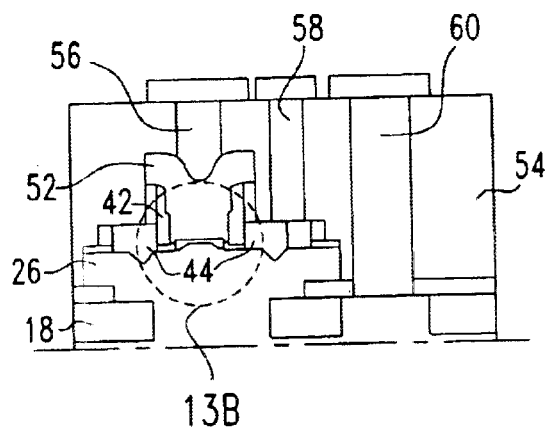
Figure 13B:
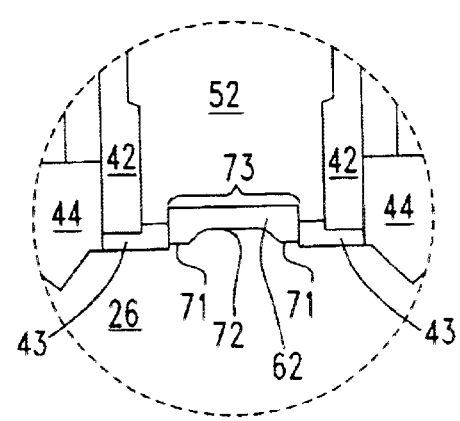
Figure 14:
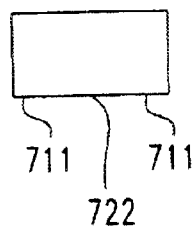
FIG. 14 is an enlarged schematic view of an emitter having a planar edge 711,722 according to the prior art.
Figure 15:
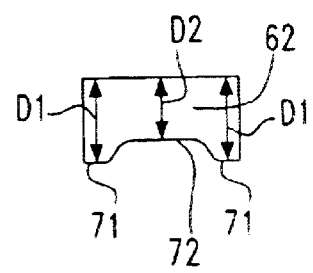
FIG. 15 is an enlarged schematic view of an emitter having a non-planar junction 71, 72, or non-uniform depth junction, according to the present invention.

Standard photolithographic steps are then employed to mask portions of SiGe film 26, followed by an anisotropic etch, and formation of base contact regions, as shown in FIG. 12. Conventional drive-in emitter anneal, salicide and dielectric deposition (to form layer 54), contact formation, and metal interconnect formation steps are then employed to form an emitter contact or electrode 56, a base contact or electrode 58, and a collector contact or electrode 60, separated from each other by a film 54, as shown in FIG. 13A. The anneal, performed at a temperature of 900 to 1000 degrees Celsius for between 1 second to 5 minutes, diffuses the emitter dopants from the film 52 into the intrinsic base film 26 or pedestal 73. The dopant diffuses farther into the intrinsic base film at the lateral portions of the silicon pedestal relative to the center portion of the pedestal, because the source of the emitter dopant (emitter film 52) extends farther into the intrinsic base film adjacent to the lateral portions compared to the center edge.

FIG. 13A shows the complete bipolar device having a non-uniform depth base-emitter junction of the present invention. There is an emitter region enlargement—FIG. 13B. This shows the silicon pedestal 73, and the emitter film 52 above and surrounding this pedestal 73. The emitter comprises pedestal 73 and film 52. The FIG. 13B also shows the diffused-in emitter dopant 62, more shallow in the center portion of the emitter pedestal, and more deep at the lateral portions of the emitter pedestal. The dopant forms a junction with the intrinsic base, and this junction is deeper at the lateral portions 71 and more shallow at the center portion 72. In other words, the base-emitter junction is configured such that the emitter has a depth D1 at its lateral portions, while the emitter has a depth D2 at its center portion; D1 being greater than D2. See FIG. 15. Preferably, D1 is a depth within a range of 20–40 nm while D2 is a depth within a range of 10–30 nm.

It will be apparent to those skilled in the art that various modifications and variations can be made in the bipolar device and method of the present invention, and in construction of this bipolar device without departing from the scope or spirit of the invention. Examples of which were provided previously, and further include the following. For example, mandrel films 28, 30, 32 may be made from materials other than polysilicon and silicon nitride. Sidewall spacers 42 may be formed following removal of emitter mandrel films 30, 32, and may be omitted altogether. A selective epitaxy process may be used to form raised extrinsic base 44. Finally, an alternate sidewall recess may be employed. For instance passivation film 43 may be omitted, and a silicon nitride etch may be used to form a recess adjacent to the spacer and the silicon pedestal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A bipolar transistor, comprising:
   a substrate;
   a semiconductor intrinsic base layer formed by blanket epitaxy on the substrate, wherein the semiconductor intrinsic base layer includes silicon germanium;
   a collector layer formed on the substrate;
   an emitter formed over the semiconductor intrinsic base layer, forming a junction between the semiconductor intrinsic base layer and the emitter, wherein the junction at a lateral portion of the emitter extends farther into the intrinsic base layer than the junction at a center portion of the emitter;
   an extrinsic base formed adjacent to the lateral portion of the emitter;
   a base electrode formed on a portion of the collector layer; and
   an emitter electrode formed on a portion of the emitter.

2. The bipolar transistor as claimed in claim 1, wherein the emitter comprises a pedestal having a top which contacts an emitter layer.

3. The bipolar transistor as claimed in claim 1, wherein a raised extrinsic base layer is formed above the intrinsic base layer and comprises one of a highly-doped polysilicon or a highly-doped amorphous silicon.

4. The transistor as claimed in claim 1, wherein the lateral portion has a depth in a range of approximately 20–40 nm.

5. The bipolar transistor claimed in claim 3, further comprising a sidewall spacer formed between and electrically isolating the emitter and the extrinsic base layer.

6. The bipolar transistor as claimed in claim 5, wherein the sidewall spacer comprises one of a silicon nitride, a silicon dioxide, or a combination of the two.

7. The bipolar transistor as claimed in claim 6, wherein the sidewall spacer has a width in the range of 10 to 70 nanometers.

8. The bipolar transistor as claimed in claim 2, wherein the emitter layer comprises one of a polysilicon or an amorphous silicon.

9. The bipolar transistor as claimed in claim 1, wherein the emitter layer has a thickness in the range of 30 to 200 nanometers.

10. The bipolar transistor as claimed in claim 1, wherein the emitter is in-situ doped with phosphorous that minimizes drive-in and activation anneal temperatures.

* * * * *